United States Patent [19]
Yoshikawa

[11] Patent Number: 5,933,366
[45] Date of Patent: Aug. 3, 1999

[54] MULTISTATE MEMORY DEVICE WITH REFERENCE BIT LINES

[75] Inventor: Sadao Yoshikawa, Gifu-ken, Japan

[73] Assignee: Sanyo Electric Co., Ltd., Osaka, Japan

[21] Appl. No.: 08/980,884

[22] Filed: Nov. 28, 1997

[30] Foreign Application Priority Data

Nov. 29, 1996 [JP] Japan .................................. 8-320352
Nov. 29, 1996 [JP] Japan .................................. 8-320353

[51] Int. Cl.$^6$ .................................................. G11C 11/34
[52] U.S. Cl. .................... 365/185.03; 365/207; 365/210; 365/185.2
[58] Field of Search .............................. 365/185.03, 210, 365/207, 185.2

[56] References Cited

U.S. PATENT DOCUMENTS

| | | | |
|---|---|---|---|
| 5,138,579 | 8/1992 | Tatsumi et al. ........................ | 365/203 |
| 5,293,345 | 3/1994 | Isahashi ................................. | 365/210 |
| 5,450,361 | 9/1995 | Iwahashi et al. ...................... | 365/200 |

OTHER PUBLICATIONS

Baier. et al., "A Multilevel–Cell 32 Mb Flash Memory", Paper TA 7.7, IEEE International Solid State Circuits Conference, 1995, pp. 132–133.

*Primary Examiner*—David Nelms
*Assistant Examiner*—Hoai V Ho
*Attorney, Agent, or Firm*—Sheridan Ross P.C.

[57] ABSTRACT

A nonvolatile semiconductor memory device includes a plurality of floating gate type memory cell transistors, connected in parallel between a bit line and a source line and a plurality of floating gate type reference transistors. The reference transistors are arranged in a matrix, defining rows and columns. The memory cell transistors are arranged as a column in the matrix, such that one of the memory cell transistors is associated with a row of the reference transistors. A plurality of reference bit lines are connected to a respective drain of each of the memory cell transistors in a respective column. Each reference bit line has a capacitance different than the other reference bit lines, which allows multi-state information stored in the memory cell transistors to be determined in accordance with a dropping speed of the potential of the bit lines and plurality of respective reference bit lines.

18 Claims, 12 Drawing Sheets

MULTISTATE MEMORY DEVICE WITH REFERENCE BIT LINES

BACKGROUND OF THE INVENTION

The present invention relates generally to a nonvolatile semiconductor memory device. More particularly, the present invention relates to a nonvolatile semiconductor memory device which stores multi-state data using memory cell transistors having floating gates.

An electrically erasable and programmable ROM (EEPROM) has memory cells each comprising a single transistor having a floating gate and a control gate. Using such memory cell transistors with a double gate structure, data is written in each memory cell by injecting hot electrons, generated in the drain region, into the floating gate. Data is read out by detecting the operational characteristic of the memory cell transistor which varies in accordance with the charge that is stored in the floating gate.

FIG. 1 is a schematic plan view partially showing memory cells of a nonvolatile semiconductor memory device. FIG. 2 is a cross-sectional view taken along the line 2—2 in FIG. 1. Each memory cell is embodied in the form of a transistor with a split gate structure, where the floating gate and the control gate are so arranged that a part of the control gate covers the floating gate.

A plurality of isolation regions 2 each comprising an oxide film (LOCOS) which is relatively thick, and device regions are alternately defined on the surface of a P type silicon substrate 1. A first oxide film 3 is located on the silicon substrate 1, with a floating gate 4 so arranged on the oxide film 3 as to lie over the adjoining isolation regions 2. The floating gate 4 is provided for each memory cell. The floating gate 4 has sharp projections at its end portions. A second oxide film 5, which is thick in the center, is located on the floating gate 4. The projections of the floating gate 4 prevent an electric field from being concentrated at the end portions of the floating gate 4 at the time of erasing data.

Disposed over the silicon substrate 1 is a control gate 6 that has a first portion which covers the floating gate 4 and a second portion, located on the oxide film 3. The floating gate 4 and the control gate 6 are so arranged as to be symmetrical to each other over adjoining columns of memory cells.

An N type first diffusion layer 7 is defined in the surface of the substrate region between the adjoining control gates 6. An N type second diffusion layer 8 is defined in the surface of the substrate region between the adjoining floating gates 4. The floating gate 4, the control gate 6, the first diffusion layer 7 and the second diffusion layer 8 form a memory cell transistor. Located on the control gate 6 is a third oxide film 9 on which an aluminum line 10 is laid in such a way as to intersect the control gate 6. The aluminum line 10 is connected via a contact hole 11 to the first diffusion layer 7.

The ON-resistance between the source and drain of the aforementioned memory cell transistor varies in accordance with the amount of charge stored in the floating gate 4. Multi-state data can therefore be stored in each memory cell transistor by controlling the amount of charge stored in the floating gate 4 in such a way that the ON-resistance of the memory cell transistor varies stepwise. For example, four-state (2 bits: "00", "01", "10" and "11") data can be stored in a single memory cell transistor by controlling the amount of charge stored in the floating gate 4 in such a manner that the ON-resistance of the memory cell transistor varies in four steps.

FIG. 3 is a schematic circuit diagram of a prior art nonvolatile semiconductor memory device using the memory cells in FIG. 1. Referring to FIG. 3, the memory cells are arranged three rows by three columns. The control gate 6 of each memory cell transistor 20 is connected to a word line 21, and the first diffusion layer 7 and the second diffusion layer 8 are respectively connected to a bit line 22 and a source line 23. Each bit line 22 is connected to a data line 25 via an associated select transistor 24, while each source line 23 is connected to a power line 26. Normally, the control gate 6 of each memory cell transistor 20 serves as the word line 21, and the second diffusion layer 8 serves as the source line 23. Further, the aluminum line 10 connected to the first diffusion layer 7 serves as the bit line 22.

A row decoder 27, connected to the individual word lines 21, selects one of the word lines 21 in response to row selection information. As a result, a group of memory cell transistors 20 in a specific row are enabled. A column decoder 28, connected to the individual select transistors 24, turns on one of the select transistors 24 in response to column selection information which enables a group of memory cell transistors 20 in a specific column. The row decoder 27 and the column decoder 28 operate to enable one of a plurality of memory cell transistors 20 and connect the selected transistor to the data line 25.

Writing multi-state data into the memory cell transistors 20 requires a high writing precision for which injection (writing) of charge and verification (reading) of the amount of charge injected are alternately repeated in a short cycle. That is, data reading from the memory cell transistors 20 is carried out while writing data in the memory cell transistors 20. When the read data matches with the desired written data, the writing operation stops.

In the writing operation of the selected memory cell transistor 20, as a ground potential (e.g., 0 V) is applied to the data line 25 and a power supply potential for writing (e.g., 12 V) is applied to the power line 26, charge is injected to the floating gate 4 of the memory cell transistor 20.

In the reading operation of the selected memory cell transistor 20, as a power supply potential for reading (e.g., 2 V) is applied to the data line 25 and the ground potential (e.g., 0 V) is applied to the power line 26, a sense amplifier (not shown) detects the resistance of the transistor 20 when the memory cell transistor 20 is turned on. FIG. 4 is a block diagram of the sense amplifier. The sense amplifier includes a pair of load resistors 31 and 32, a pair of current amplifiers 33 and 34, a reference transistor 35, a constant potential generator 36, a differential amplifier 37 and a decision control circuit 38.

The pair of load resistors 31 and 32, connected to a power supply, have the same resistance. The current amplifier 33, connected to the load resistor 31 and the data line 25, includes a transistor and an inverter. The current amplifier 34, connected to the load resistor 32 and the reference transistor 35, includes a transistor and an inverter. The reference transistor 35, connected between the current amplifier 34 and ground, changes the resistance in response to a reference potential $V_{RG}$ which is applied to the gate. The constant potential generator 36 generates the reference potential $V_{RG}$ corresponding to multi-state data to be stored in the memory cell transistor 20, and supplies that reference potential $V_{RG}$ to the gate of the reference transistor 35. For the memory cell transistors 20 each capable of storing 4-state data (2 bits), for example, the constant potential generator 36 generates three kinds of gate potentials $V_{RG}$ so that the resistance of the reference transistor 35 varies in three steps.

The differential amplifier 37 has a first input terminal connected to a node between the load resistor 31 and the current amplifier 33, and a second input terminal connected to a node between the load resistor 32 and the current amplifier 34. The differential amplifier 37 compares potentials $V_B$ and $V_{RL}$ at the nodes with each other and sends a comparison output CO to the decision control circuit 38.

The decision control circuit 38 controls the constant potential generator 36 and determines the multi-state data from the comparison output CO from the differential amplifier 37 to reproduce the multibit data. In the case of 4-state information, for example, an intermediate one of three-level reference potentials, namely a high potential, an intermediate potential and a low potential, is generated first to determine whether the upper bit is "1" or "0". Then, the high potential or low potential is generated in accordance with the result of the decision on the upper bit in order to determine whether the lower bit is "1" or "0".

When data is read from the memory cell transistor 20, as shown in FIG. 4, the source of the memory cell transistor 20 is grounded and the load resistor 31 and the memory cell transistor 20 are connected in series between the power supply and the ground via the current amplifier 33. Likewise, the load resistor 32 and the reference transistor 35 are connected in series between the power supply and the ground via the current amplifier 34. Therefore, the potential $V_B$ at the node between the load resistor 31 and the current amplifier 33, is determined by the ratio of the resistance of the load resistor 31 to the drive performance of the memory cell transistor 20. Likewise, the potential $V_{RL}$ at the node between the load resistor 32 and the current amplifier 34, is determined by the ratio of the resistance of the load resistor 32 to the drive performance of the reference transistor 35. It is possible to determine in what range the resistance of the memory cell transistor 20 lies with respect to the resistance of the reference transistor 35 by comparing the determined potentials $V_B$ and $V_{RL}$ using the differential amplifier 37.

Since the sense amplifier reads data in accordance with the ratio of the resistance of the memory cell transistor to the resistance of the load resistor 31 and the resistance of the reference transistor 35 to the resistance of the load resistor 32, it is important to precisely set the resistances of the load resistors 31 and 32. The resistances of the load resistors 31 and 32 are normally set in accordance with the resistance of the memory cell transistor 20. When the resistances of the load resistors 31 and 32 are shifted to the larger side or smaller side than the optimal values, the potentials $V_B$ and $V_{RL}$ at the nodes show small changes with respect to a change in the resistance of the memory cell transistor 20. Such a small variation makes it difficult for the differential amplifier 37 to accurately output the comparison result.

The reference transistor 35 and the constant potential generator 36 should keep operations stable in order to prevent the differential amplifier 37 to always acquire the stable reference potential $V_{RL}$. However, there is a variation, in the manufacture stage, in elements which constitute the constant potential generator 36. To always supply the stable gate potential $V_{RG}$, therefore, a circuit is required for finely adjusting the potential of the constant potential generator 36. Such a circuit increases the circuit area of the sense amplifier and also increases the manufacturing cost, of the memory.

SUMMARY OF THE INVENTION

The present invention relates to a nonvolatile semiconductor memory device which accurately reads multi-state information from memory cell transistors. The present invention can be implemented in numerous ways including as an apparatus and a method.

Briefly stated, the present invention provides a nonvolatile semiconductor memory device for storing two or more states. The device includes: a bit line; a plurality of memory cell transistors connected in parallel to the bit line, wherein each memory cell transistor has an insulated floating gate electrode in which a charge is stored, and each memory cell transistor changes a resistance thereof, when enabled, in accordance with the amount of charge stored in the floating gate electrode; a plurality of reference bit lines having mutually different capacitances, wherein the bit line and the plurality of reference bit lines are charged to a predetermined potential; a plurality of reference transistors connected in parallel to each reference bit line and having the same structure as the memory cell transistors, a single row comprising one memory cell transistor and a plurality of reference transistors, each row of the memory cell transistor and the plurality of reference transistors being selectively enabled at a time; and a decision circuit, connected to the bit line and the plurality of reference bit lines, for comparing a potential of the bit line with a potential of each of the reference bit lines to determine information,stored in the selected memory cell transistor when a current flows to the memory cell transistor and the plurality of reference transistors in a selected row from the bit line and the plurality of reference bit lines charged to the predetermined potential.

The present invention further provides a nonvolatile semiconductor memory device for storing two or more states. The device includes: a bit line; a plurality of memory cell transistors connected in parallel to the bit line, each memory cell transistor having an insulated floating gate electrode in which a charge is stored, and each memory cell transistor changes its own resistance, when enabled, in accordance with the amount of charge stored in the floating gate electrode; a plurality of reference bit lines having mutually different capacitances, the bit line and the plurality of reference bit lines being charged to a predetermined potential; plurality of reference transistors connected in parallel to each reference bit line and having the same structure as the memory cell transistors, a single row comprising one memory cell transistor and a plurality of reference transistors, each row of the memory cell transistor and the plurality of reference transistors being selectively enabled at a time; and a decision circuit, connected to the bit line and the plurality of reference bit lines, for comparing a potential of the bit line with a potential of each of the reference bit lines to determine information stored in the selected memory cell transistor after a predetermined period of time passes since flowing of a current to the memory cell transistor and the plurality of reference transistors in a selected row from the bit line and the plurality of reference bit lines charged to the predetermined potential.

The present invention provides a nonvolatile semiconductor memory device including: a plurality of memory cell transistors, each memory cell transistor having an insulated floating gate electrode in which a charge is stored, and each memory cell transistor changing a resistance thereof, when enabled, in accordance with an amount of charge stored in the floating gate; a bit line connected to a drain of each of the memory cell transistors; a source line connected to a source of each of the memory cell transistors, such that each of the memory cell transistors is connected in parallel between the bit line and the source line; a plurality of reference transistors having generally the same structure as the memory cell transistors, the reference transistors being arranged in matrix, thereby defining rows and columns, and wherein the memory cell transistors are arranged as a column in the matrix such that one of the memory cell transistors is associated with a row of the reference transistors; a plurality of reference bit lines, each of the reference bit lines connected to a respective drain of each of the memory cell transistors in a respective column of the memory cell transistors, wherein each reference bit line has a capacitance different than the other reference bit lines; a plurality of word lines, each of the word lines connected to a respective gate of the memory cell transistors and the reference transistors in a respective row, the word lines for enabling the respective rows; and a decision circuit for comparing the potential of each of the reference bit lines with a predetermined decision potential, wherein multi-state information stored in the memory cell transistors is determined in accordance with a dropping speed of the potential of the bit lines and the plurality of the reference bit lines.

The present invention further provides a method of determining information stored in a plurality of memory cell transistors in a nonvolatile semiconductor memory device having the memory cell transistors connected in parallel to a bit line. Each of the plurality of memory cell transistors has an insulated floating gate electrode in which a charge is stored. Each memory cell transistor changes its own resistance, when enabled, in accordance with the amount of charge stored in the floating gate electrode. The method includes the steps of: providing a plurality of reference bit lines having mutually different capacitances; providing a plurality of reference transistors connected in parallel to each reference bit line and having the same structure as the memory cell transistors, a single row comprising one memory cell transistor and a plurality of reference transistors; charging the bit line and the plurality of reference bit lines to a predetermined potential; selectively enabling each row of the memory cell transistor and the plurality of reference transistors at a time, thereby allowing a current to flow to the memory cell transistor and the plurality of reference transistors in a selected row from the bit line and the plurality of reference bit lines; and comparing a fluctuation of a potential of the bit line with a potential of each of the reference bit lines to determine information stored in the memory cell transistor in the selected row.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 5:
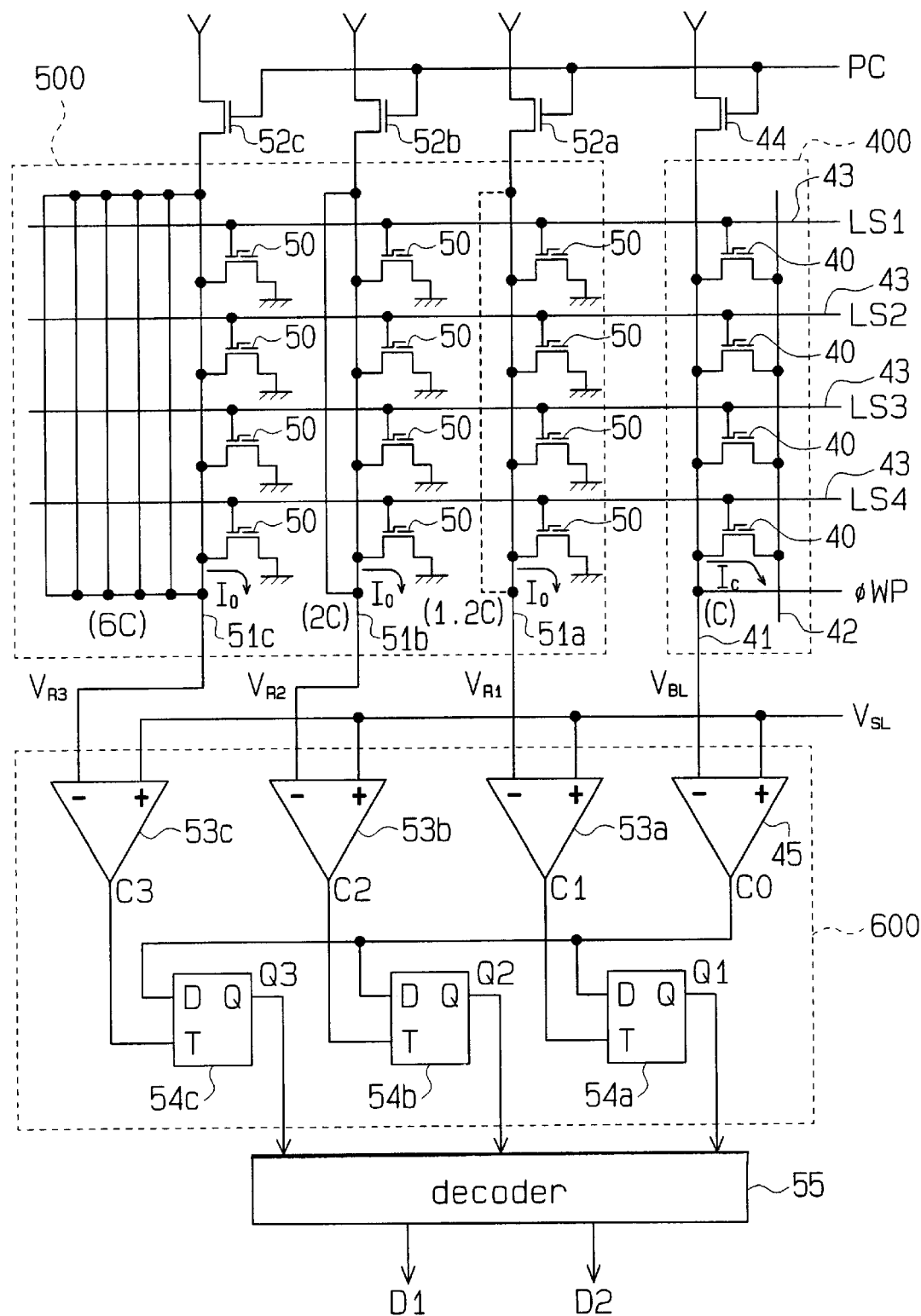
FIG. 5 is a block diagram of a nonvolatile semiconductor memory device according to a first embodiment of the present invention.

A nonvolatile semiconductor memory device according to a first embodiment of the present invention will now be described referring to the accompanying drawings. As shown in FIG. 5. the nonvolatile semiconductor memory device according to the first embodiment comprises a memory cell array 400 including a plurality of memory cell transistors 40, a reference transistor group 500 including a plurality of reference transistors 50, a discrimination circuit 600, a decoder 55 and precharge transistors 44 and 52a to 52c. For easier understanding, the memory cell transistors 40 are arranged four rows by one column, and a column-selecting circuit is omitted. The present invention is adapted to the case where each memory cell transistor 40 stores information of four states (2 bits).

Figure 1:
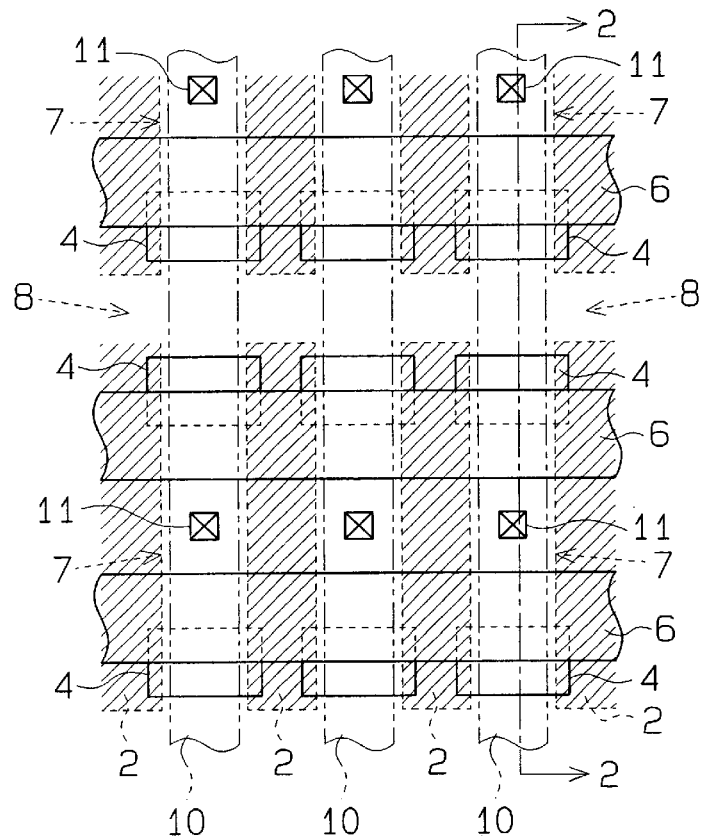
FIG. 1 is a schematic plan view partially showing a prior art memory cells of a nonvolatile semiconductor memory device.
Figure 2:
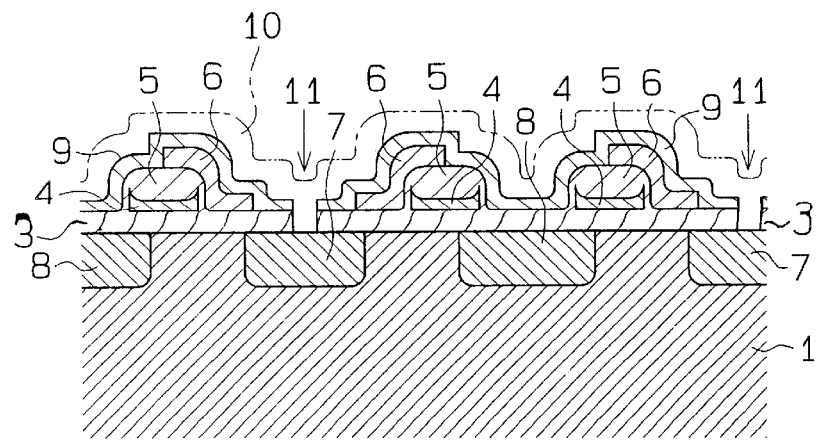
FIG. 2 is a cross-sectional view taken along the line 2—2 in FIG. 1.
Figure 3:
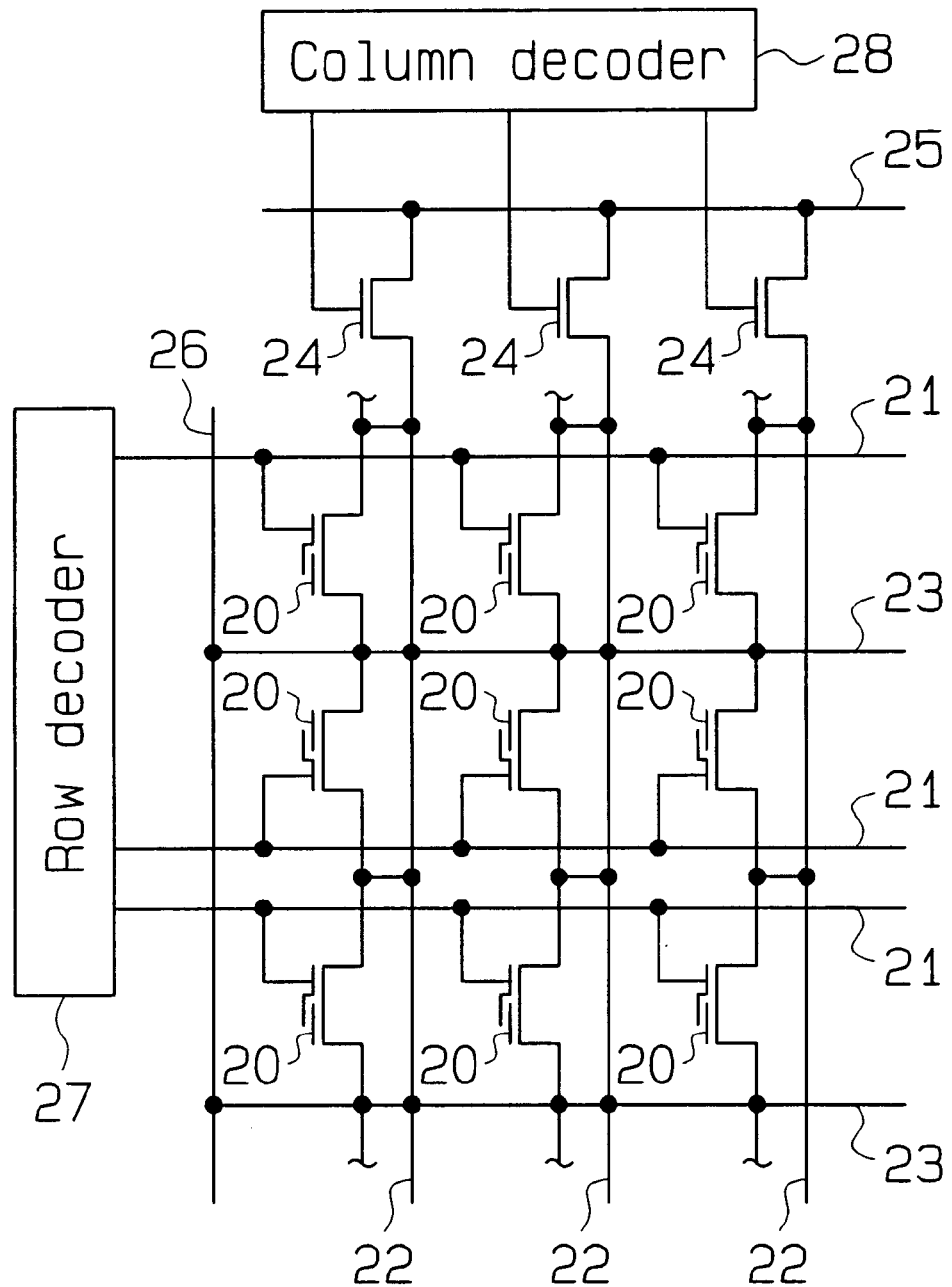
FIG. 3 is a schematic circuit diagram of a prior art nonvolatile semiconductor memory device using the memory cells in FIG. 1.
Figure 4:
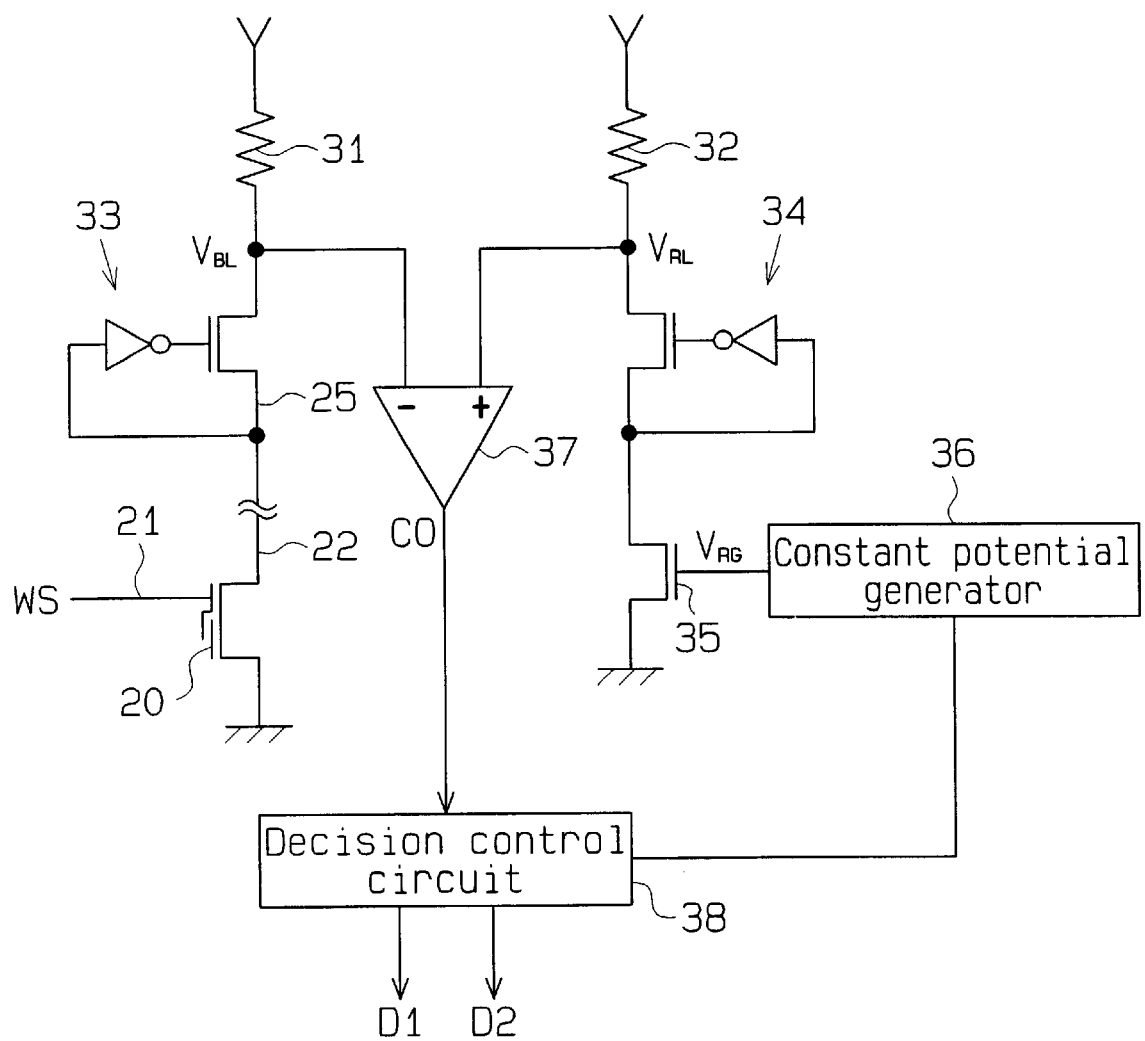
FIG. 4 is a schematic block diagram of a sense amplifier of prior art the nonvolatile semiconductor memory device of FIG. 1.

The memory cell transistor 40, like that of the prior art (FIG. 2), has a floating gate and a control gate and is designed so that the ON-resistance changes in accordance with the amount of charge injected (stored) in the floating gate.

The nonvolatile semiconductor memory device has a bit line 41 connected to the drains of the memory cell transistors 40, which are arranged in the same column, and a source line 42 connected to the sources of the individual memory cell transistors 40. The source line 42 is preferably laid substantially parallel to the bit line 41. The individual memory cell transistors 40 are connected in parallel between the bit line 41 and the source line 42, and perform a reading or erasing operation as a predetermined potential is applied to the bit line 41 and the source line 42. The memory device further has word lines 43 connected to the control gates of the individual memory cell transistors 40. The word lines 43 are arranged for the respective rows of the memory cell transistors 40. A corresponding row select signal LS1 to LS4 is applied to an associated one of the word lines 43 by a row decoder (not shown) in order to selectively enable the memory cell transistor 40 in one row.

Each reference transistor 50 has the same structure (size) as the memory cell transistor 40, and is kept in an erased state in which no charge is stored in the floating gate. To determine 4-state information stored in the memory cell transistors 40, three reference transistors 50 are assigned to the memory cell transistor in each row. Therefore, the reference transistors 50 are arranged four rows by three columns. The control gates of each row of reference transistors 50 are connected to the associated word line 43. Thus, the row of reference transistors 50 associated with the memory cell transistor 40 in the selected row are simultaneously selected by any of the row select signals LS1 to LS4.

The nonvolatile semiconductor memory device has first to third reference bit lines 51a to 51c respectively connected to the drains of the first to third columns of the reference transistors 50. The first to third reference bit lines 51a–51c run generally parallel to the bit line 41. The first to third columns of reference transistors 50 are connected in parallel between the first to third reference bit lines 51a–51c and the ground, respectively. The first reference bit line 51a has a capacitance (1.2C) about 6/5 times the capacitance (C) of the bit line 41. The second reference bit line 51b has a capacitance (2C) about double the capacitance (C) of the bit line 41, and the third reference bit line 51c has a capacitance (6C), which is about six times the capacitance of the bit line 41. Connecting a plurality of lines having the same structure as the bit line 41 to the columns of reference transistors 50 in parallel can provide bit lines having different capacitances. For example, the second reference bit line 51b having a double capacitance comprises two lines connected in parallel to the second column of the reference transistors 50, each line having the same structure as the bit line 41. The third reference bit line 51c having a 6× capacitance comprises six lines connected in parallel to the third column of the reference transistors 50, each line having the same structure as the bit line 41. The first reference bit line 51a having a 1.2-time capacitance comprises two lines connected in parallel to the first column of the reference transistors 50, one line having the same structure as the bit line 41 and the other having a length which is shortened to about one fifth of that of the bit line 41.

The precharge transistor 44, connected between the power supply and the bit line 41, performs a switching action in response to a precharge signal PC which is applied to its gate. The switching action allows the bit line 41 to be charged to the potential of the power supply. The first to third precharge transistors 52a to 52c, connected between the first to third reference bit lines 51a–51c and the power supply, perform switching actions in response to precharge signals which are applied to their respective gates. The switching actions allow the reference bit lines 51a–51c to be charged to the power supply potential at the same time as the bit line 41. Preferably, the precharge signal PC is set in such a way that after the bit line 41 and the first to third reference bit lines 51a–51c are charged to the power supply potential, the precharge transistors 44 and 52a–52c are turned off before the selection of the word line 43.

The discrimination circuit 600 determines multi-state information stored in the memory cell transistors 40 by comparing the potential $V_{BL}$ of the bit line 41 with the potentials $V_{R1}$ to $V_{R3}$ of the first to third reference bit lines 51a–51c. The decoder 55 decodes the result of the determination and generates 2-bit data D1 and D2. The discrimination circuit 600 and the decoder 55 form a sense amplifier.

The discrimination circuit 600 has differential amplifiers 45 and 53a to 53c and flip-flops 54a to 54c. The differential amplifier 45 has an inverting input terminal for receiving the potential $V_{BL}$ of the bit line 41, a non-inverting input terminal for receiving a decision potential $V_{SL}$ which is set to a predetermined value between the ground potential and the power supply potential, and an output terminal for supplying a comparison output C0, originating from comparison between both potentials $V_{BL}$ and $V_{SL}$ to the data input terminals of the first to third flip-flops 54a–54c. The first differential amplifier 53a has an inverting input terminal for receiving the reference potential $V_{R1}$ of the first reference bit line 51a, a non-inverting input terminal for receiving the decision potential $V_{SL}$, and an output terminal for supplying a comparison output C1 to the timing input terminal of the first flip-flop 54a. The second differential amplifier 53b has an inverting input terminal for receiving the reference potential $V_{R2}$ of the second reference bit line 51b, a non-inverting input terminal for receiving the decision potential $V_{SL}$, and an output terminal for supplying a,comparison output C2 to the timing input terminal of the second flip-flop 54b. The third differential amplifier 53c has an inverting input terminal for receiving the reference potential $V_{R3}$ of the third reference bit line 51c, a non-inverting input terminal for receiving the decision potential $V_{SL}$, and an output terminal for supplying a comparison output C3 to the timing input terminal of the third flip-flop 54c.

The first flip-flop 54a latches the comparison output C0 of the differential amplifier 45 in response to the rising of the comparison output C1 of the first differential amplifier 53a, and sends a latch output Q1 to the decoder 55. The second flip-flop 54b latches the comparison output C0 of the differential amplifier 45 in response to the rising of the comparison output C2 of the second differential amplifier 53b, and sends a latch output Q2 to the decoder 55. The third flip-flop 54c latches the comparison output C0 of the differential amplifier 45 in response to the rising of the comparison output C3 of the third differential amplifier 53c, and sends a latch output Q3 to the decoder 55. The decoder 55 receives the latch outputs Q1–Q3 from the first to third flip-flops 54a–54c and generates the 2-bit digital data D1 and D2.

The individual memory cell transistors 40 and the individual reference transistors 50 have, the minimum ON-resistances when no data is written, i.e., when no charge is injected in their floating gates. The ON-resistance becomes larger as the amount of charge injected into the floating gate increases. Charge whose amount corresponding to multi-state information is injected into the floating gate of each,memory cell transistor 40. This means that each memory cell transistor 40 has a predetermined ON-resistance corresponding to multi-state information. In contrast, in the erased state, each reference transistor 50 has the minimum resistance.

Figure 6:
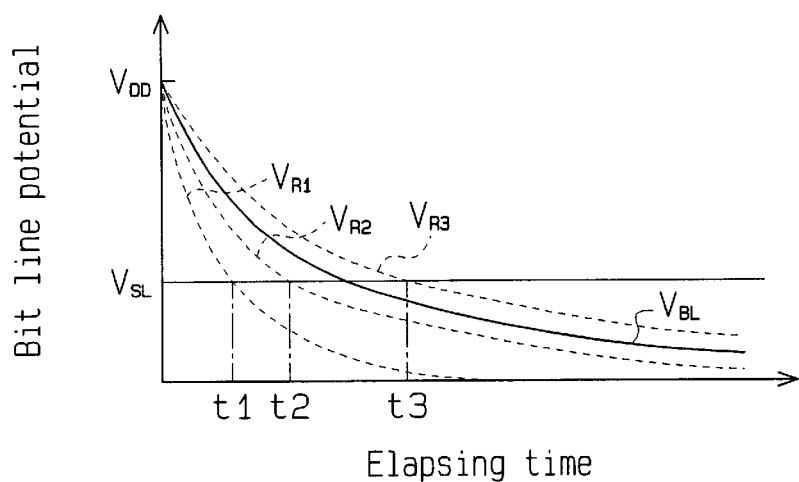
FIG. 6 is a graph showing the relationship between the potential of a reference bit line and the elapsing time in a reading operation of the memory device in FIG. 5.

A description will now be given of an operation of reading multi-state information stored in each memory cell transistor 40. First, the bit line 41 and the first to third reference bit lines 51a–51c are charged to the power supply potential, and the ground potential is applied to the source line 42. Then, one of the word lines 43 is selected in accordance with the row select signal LS1, LS2, LS3 or LS4, and the reference transistors so associated with the selected word line 43 are enabled. As a result, the first to third reference bit lines 51a–51c are grounded via the enabled reference transistors 50. At this time, currents $I_0$ of the same amount flow through the reference transistors 50. Since the ratio of the capacitances of the first to third reference bit lines 51a–51c is about 1.2:2:6, the dropping speeds of the first to third reference potentials $V_{R1}$ to $V_{R3}$ differ from one another as shown in FIG. 6. When the first to third reference potentials $V_{R1}$ to $V_{R3}$ drop down to the predetermined decision potential $V_{SL}$, the differential amplifiers 45 and 53a–53c and the flip-flops 54a–54c determine if the bit line potential $V_{BL}$ is higher or lower than the decision potential $V_{SL}$.

More specifically, the dropping speeds of the first to third reference potentials $V_{R1}$–$V_{R3}$ are determined by the capacitances of the first to third reference bit lines 51a–51c and the current $I_0$ that flows through each reference transistor 50. As previously discussed, with respect to the capacitance of the bit line 41, the second reference bit line 51b has about a double capacitance, the third reference bit line 51c has a about a sextuple capacitance, and the first reference bit line 51a has about a 1.2-time capacitance. Therefore, the potential $V_{R2}$ of the second reference bit line 51b drops faster than the potential $V_{R3}$ of the third reference bit line 51c. The potential $V_{R1}$ of the first reference bit line 51a drops faster than the potential $V_{R2}$ of the second reference bit line 51b.

By contrast, the ON-resistance of the memory cell transistor 50 varies in accordance with the amount of charge injected to the floating gate. Thus, the current $I_C$ which flows through the memory cell transistor 40 also varies in accordance with the amount of charge injected into the floating gate. The dropping speed of the bit line potential $V_{BL}$ is therefore determined by the amount of charge injected into the floating gate of the memory cell transistor 40. In other words, it is possible to determine the amount of charge injected into the floating gate of the memory cell transistor 40 or the information written state by measuring the dropping speed of the bit line potential $V_{BL}$.

For instance, that the bit line potential $V_{BL}$ drops to a level between the second reference potential $V_{R2}$ and the third reference potential $V_{R3}$, as shown in FIG. 6. In this case, the bit line potential $V_{BL}$ is higher than the decision potential $V_{SL}$ at timings t1 and t2 when the first and second reference potentials $V_{R1}$ and $V_{R2}$ reach the decision potential $V_{SL}$. At time t3 when the third reference potential $V_{R3}$ reaches the decision potential $V_{SL}$, the bit line potential $V_{BL}$ is lower than the decision potential $V_{SL}$ Therefore, the first to third flip-flops 54a–54c latch the comparison outputs C1 of "H", C2 of "H" and C3 of "L" and send the latch outputs Q1 of "H", Q2 of "H" and Q3 of "L" to the decoder 55. The decoder 55 decodes the latch outputs Q1 of "H", Q2 of "H" and Q3 of "L" and produces 2-bit data D1 and D2 of "1, 0".

In this manner, 2-bit data is acquired by discriminating four-level or four-state information by comparing the bit line potential $V_{BL}$ with the first to third reference potentials $V_{R1}$ to $V_{R3}$. When the dropping speed of the bit line potential $V_{BL}$ is faster than that of the first reference potential $V_{R1}$, for example, 2-bit data D1 and D2 of "0, 0" are obtained. When the dropping speed of the bit line potential $V_{BL}$ is slower than that of the first reference potential $V_{R1}$, but faster than that of the second reference potential $V_{R2}$, 2-bit data D1 and D2 of "0, 1" are obtained. When the dropping speed of the bit line potential $V_{BL}$ is slower than that of the second reference potential $V_{R2}$, but faster than that of the third reference potential $V_{R3}$, 2-bit data D1 and D2 of "1, 0" are obtained. When the dropping speed of the bit line potential $V_{BL}$ is slower than that of the third reference potential $V_{R3}$, 2-bit data D1 and D2 of "1, 1" are obtained.

According to the first embodiment, as apparent from the above, multi-state information is discriminated in accordance with the dropping speed of the bit line potential. The present discrimination scheme, unlike the conventional discrimination of multi-state information, does not use a resistor for acquiring, as a voltage value, the amount of the current which flows through the memory cell transistor. The discrimination scheme can, therefore, discriminate multi-state information accurately.

Figure 7:
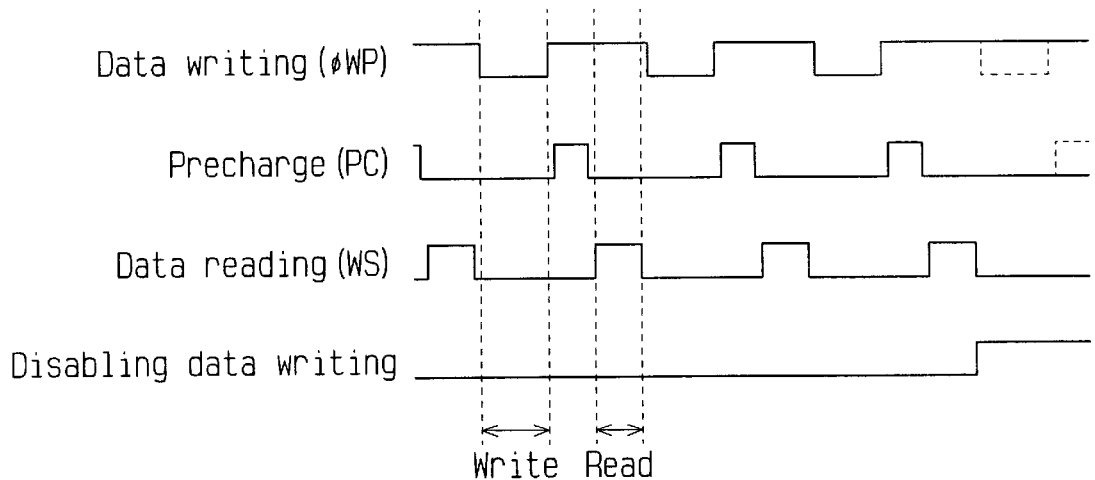
FIG. 7 is a waveform chart of various signals used in a writing operation of the memory device in FIG. 5.

When multi-state information is stored in the memory cell transistor 40, it is preferable to perform verify reading operation, which verifies the written state while injecting a charge into the floating gate stepwise. That is, as shown in FIG. 7, after a writing operation of injecting a constant amount of charge into the floating gate of the memory cell transistor 40, by dropping the potential of the bit line 41 in accordance with a write pulse $\phi_{WP}$, the verify reading operation is performed on the memory cell transistor 40 by the aforementioned scheme. The writing operation is stopped by stopping the application of the write pulse $\phi_{WP}$ when the reading result coincides with the desired information.

The timing to stop the writing operation is determined based on the first to third reference potentials $V_{R1}$–$V_{R3}$. Such a stop timing determination does not, however, produce a difference between the bit line potential $V_{BL}$ and any one of the first to third reference potentials $V_{R1}$–$V_{R3}$. In other words, the writing operation is stopped when any one of the first to third reference potentials $V_{R1}$–$V_{R3}$ matches with the bit line potential $V_{BL}$. In the reading operation of the memory cell transistor 40, in which data has been written in the above manner, the dropping speed of the bit line potential $V_{BL}$ becomes equal to that of any of the first to third reference potentials $V_{R1}$–$V_{R3}$, which disables data reading.

Figure 8:
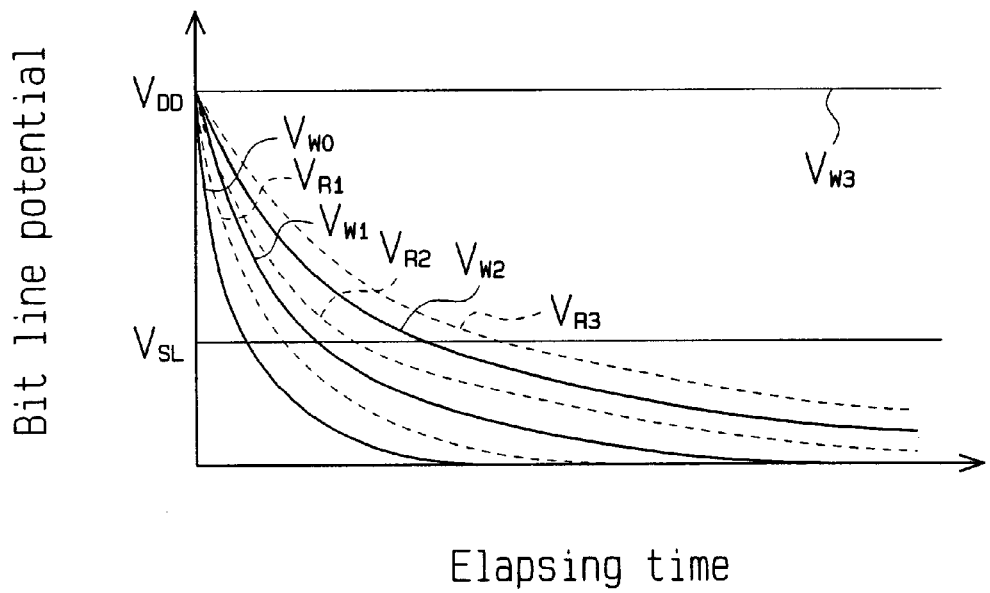
FIG. 8 is a graph illustrating the relationship between a reference potential and the elapsing time in the reading operation and the writing operation.
Figure 9:
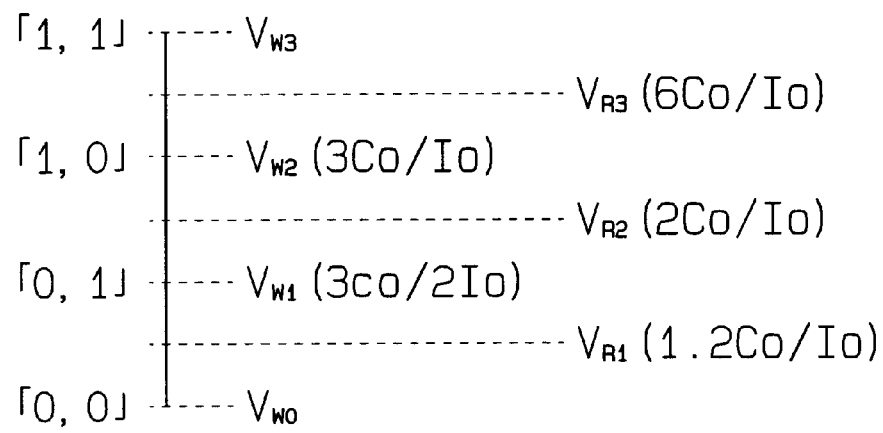
FIG. 9 is a graph depicting the relationship between the potential of a reference bit line and the elapsing time in the reading operation and the writing operation.

In executing verify reading in the writing operation, the written state is determined by using a reference potential $V_{W0}$ which drops faster than the first reference potential $V_{R1}$, a reference potential $V_{W1}$ which drops at an intermediate speed between the dropping speeds of the first and second reference potentials $V_{R1}$ and $V_{R2}$, a reference potential $V_{W2}$ which drops at an intermediate speed between the dropping speeds of the second and third reference potentials $V_{R2}$ and $V_{R3}$, and a reference potential $V_{W3}$, which keeps the power supply potential, as shown in FIG. 8. That is, the four states of the 2-bit data D1 and D2 are respectively associated with the four different reference potentials $V_{W0}$ to $V_{W3}$, as shown in FIG. 9 The writing operation is repeated until one of those reference potentials matches with the bit line potential $V_{BL}$.

To obtain a dropping speed faster than that of the first reference potential $V_{R1}$, it is desirable not to write data in the memory cell transistor 40. To acquire a dropping speed slower than that of the third reference potential $V_{R3}$, it is desirable to inject a charge into the floating gate of the memory cell transistor 40 in such a manner that the memory cell transistor 40, even when enabled, becomes off. Therefore, the reference potentials which are substantially needed in the writing operation of storing four states are two reference potentials $V_{W1}$ and $V_{W2}$.

Second Embodiment

Figure 10:
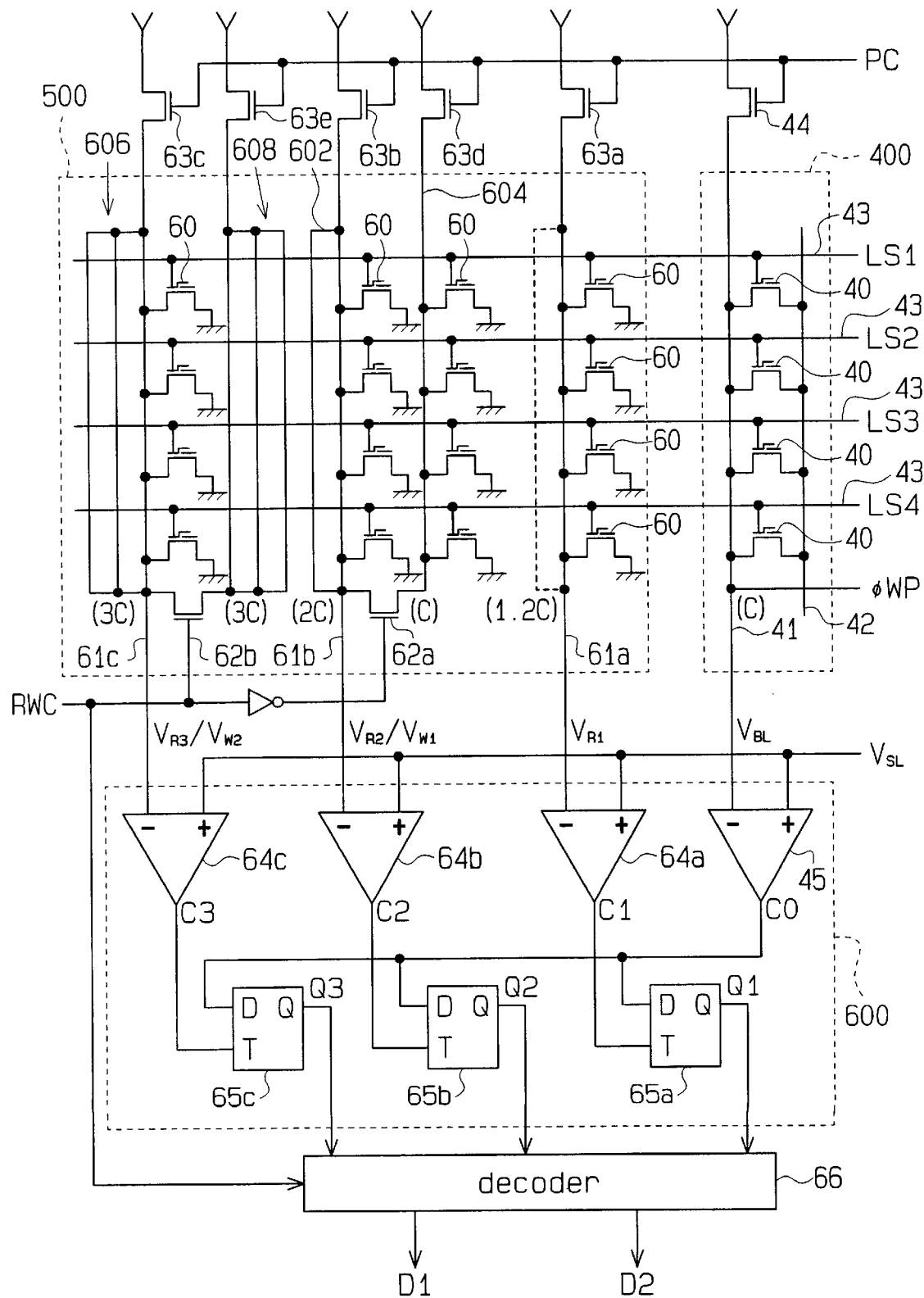
FIG. 10 is a schematic block diagram of a nonvolatile semiconductor memory device according to a second embodiment of the present invention.

A memory device according to a second embodiment will now be discussed below which can perform verify reading in the writing operation using the two reference potentials $V_{W1}$ and $V_{W2}$. Referring not to FIG. 10, the nonvolatile semiconductor memory device according to the second embodiment is designed in such a way that the potential of the reference bit line (61a–61c) is selectively changed between the writing operation and the reading operation by switching the capacitance of the reference bit line.

A reference transistor 60 has the same structure as the memory cell transistor 40. For both the determination of four-state information in the reading operation and verification of four-state information in the writing operation, four reference transistors 60 are assigned to one row of a memory cell transistor. The control gates of the reference transistors 60 are connected to an associated word line 43. Therefore, the memory cell transistor 40 and the reference transistors 60 in the associated row are selected and enabled at the same time. The memory device has first to third bit lines 61a–61c connected to the drains of the first to third columns, respectively of the reference transistors 60.

The first to third reference bit lines 61a to 61c run generally parallel to the bit line 41. Individual columns of reference transistors 60 are connected between the first to third reference bit lines 61a–61c and the ground.

The first reference bit line 61a has a capacitance of about (1.2C) 6/5 times the capacitance of the bit line 41. Specifically, the first reference bit line 61a comprises of two lines, one having the same structure as the bit line 41 and the other whose length is shortened to about one fifth of that of the bit line 41.

The second reference bit line 61b has a capacitance of about (2C) double the capacitance of the bit line 41 in the reading operation, and has about a triple capacitance (3C) with respect to the capacitance of the bit line 41 in the writing operation. Specifically, the second reference bit line 61b having a double capacitance comprises a group of two main lines 602 connected in parallel to the reference transistors 60 in the third column. The second reference bit line 61b having a triple capacitance comprises the group of main lines 602 and a single sub line 604 connected via a transistor 62a to the group of main lines 602. The reference transistors 60 in the second column are connected between the sub line 604 and the ground. The group of main lines 602 and the sub line 604 are electrically connected as the transistor 62a is turned on in response to a control signal RWC for selectively switching between the reading operation and the writing operation. The switching action of the transistor 62a provides the second reference potential $V_{R2}$, which has been determined by the ratio of the capacitance $2C_0$ of the second reference bit line 61b to the discharge current $I_0$ in the reading operation, as shown in FIG. 9. That is, the ratio $(2C_0/I_0)$ of the capacitance $(2C_0)$ of the second reference bit line 61b to the discharge current $I_0$ which flows in the reference transistor 60 in the reading operation is set to about "2". Obtained in the writing operation is the reference potential $V_{W1}$, which is determined by the ratio of the capacitance $3C_0$ of the second reference bit line 61b to the discharge current $2I_0$. That is, the ratio $(3C_0/2I_0)$ of the capacitance $(3C_0$ of the second reference bit line 61b to the discharge current $I_0$ $(2I_0)$ which flows in the second column of reference transistors 60 in the writing operation is set to about "1.5".

With respect to the bit line 41, the third reference bit line 61c has about a sextuple capacitance (6C) in the reading operation and about a triple capacitance (3C) in the writing operation. Specifically, the third reference bit line 61c having a sextuple capacitance comprises a first line group of three lines 606 connected in parallel to the fourth column of reference transistors 60, and a second line group of three lines 608 connected to the first line group 606 via a transistor 62b. The lines in the second line group 608 are connected in parallel, and are electrically connected to the first line group 606 as the transistor 62b is turned on in response to the control signal RWC. The third reference bit line 61c having a triple capacitance comprises the first line group 606. The switching action of the transistor 62b provides the third reference potential $V_{R3}$, which has been determined by the ratio of the capacitance $6C_0$ of the third reference bit line 61c to the discharge current $I_0$ in the reading operation, as shown in FIG. 9. Further, the reference potential $V_{W2}$, which is determined by the ratio of the capacitance $3C_0$ of the third reference bit line 61c to the discharge current $I_0$, is obtained in the writing operation.

First to third precharge transistors 63a to 63c are connected between the power supply and the first reference bit line 61a, the main line group 602 of the second reference bit line 61b and the first line group 606 of the third reference bit line 61c, respectively, and perform switching actions in response to precharge signals. The switching actions of the first to third precharge transistors 63a–63c connect the first reference bit line 61a, the main line group 602 and the first line group 606 to the power supply so that they are charged to the power supply potential at the same time as the bit line 41. Fourth and fifth precharge transistors 63d and 63e are connected between the power supply and the sub line 604 of the second reference bit line 61b and the second line group 608 of the third reference bit line 61c, respectively, and perform switching actions in response to precharge signals. As a result, the sub line 604 and the second line group 608 are likewise charged to the power supply potential.

First to third differential amplifiers 64a to 64c compare the potentials $V_{R1}$ to $V_{R3}$ of the first to third reference bit lines 61a–61c with a predetermined decision potential $V_{SL}$ in the reading operation. The second and third differential amplifiers 64b and 64c compare the potentials $V_{R2}$ and $V_{R3}$ of the second and third reference bit lines 61b and 61c with the decision potential $V_{SL}$ in the writing operation.

First to third flip-flops 65a to 65c, respectively, receive comparison outputs C1 to C3 from the first to third differential amplifiers 64a–64c at their timing input terminals, and latch the comparison output C0 of the differential amplifier 45 in response to the rising timings of the comparison outputs C1–C3. A decoder 66 receives latch outputs Q1 to Q3 from the first to third flip-flops 65a–65c, and produces 2-bit digital data D1 and D2.

In the reading operation, the transistor 62a is turned off, and the transistor 62b is turned on, in response to the rising of the control signal RWC. With the actions of the transistors 62a–62b, the memory device of the second embodiment carries out the same reading operation as done in the first embodiment. Accordingly, the description of the reading operation will not be repeated here.

A description will now be given of an operation of writing multi-state information in the memory cell transistor 40. In response to the falling of the control signal RWC, the transistor 62a is turned on and the transistor 62b is turned off. The actions of the transistors 62a, 62b provide the reference potential $V_{W1}$ from the second reference bit line 61b. The reference potential $V_{W1}$ is set to an intermediate value between the first reference potential $V_{R1}$ and the second reference potential $V_{R2}$. Further, the reference potential $V_{W2}$ is obtained from the third reference bit line 61c. The reference potential $V_{W2}$ is set to an intermediate value between the second reference potential $V_{R2}$ and the third reference potential $V_{R3}$. The comparison outputs C2 and C3, originating from the comparison between the reference potentials $V_{W1}$ and $V_{W2}$ and the bit line potential $V_{BL}$, are latched by the second and third flip-flops 65b and 65c in response to the rising of the comparison result C0 from the differential amplifier 45, and are then supplied to the decoder 66 as the latch outputs Q2 and Q3. Referring to the latch outputs Q2 and Q3, multi-state information is written.

In the writing operation on multi-state information, as the power supply potential for writing is applied to the source line 42 and the write pulse $\phi_{WP}$ having a given period is applied to the bit line 41, charge is gradually injected into the floating gate of the memory cell transistor 40. The verify reading with respect to the memory cell transistor 40 is carried out in the interval of the write pulses $\phi_{WP}$ after the injection of the charge. The write pulse $\phi_{WP}$ is disabled when the bit line potential $V_{BL}$ coincides with the reference potential $V_{W2}$ or $V_{W3}$.

Suppose that written information is "0, 1". As shown in FIG. 9, the written information "0, 1" corresponds to the reference potential $V_{W1}$. The timing of inhibiting the writing operation upon coincidence of the bit line potential $V_{BL}$ with the reference potential $V_{W1}$ is detected by the inversion of the latch output Q2 of the second flip-flop 65b.

When written information is "1, 0", the written information "1, 0" corresponds to the reference potential $V_{W2}$. The timing of inhibiting the writing operation upon coincidence of the bit line potential $V_{BL}$ with the reference potential $V_{W2}$ is detected by the inversion of the latch output Q3 of the third flip-flop 65c.

When written information is "0, 0", no charge is injected into the floating gate of the memory cell transistor 40. When written information is "1, 1", a given amount or more of charge is injected into the floating gate. Storing the two types of multi-state information requires no decision using the reference potentials.

Figure 11:
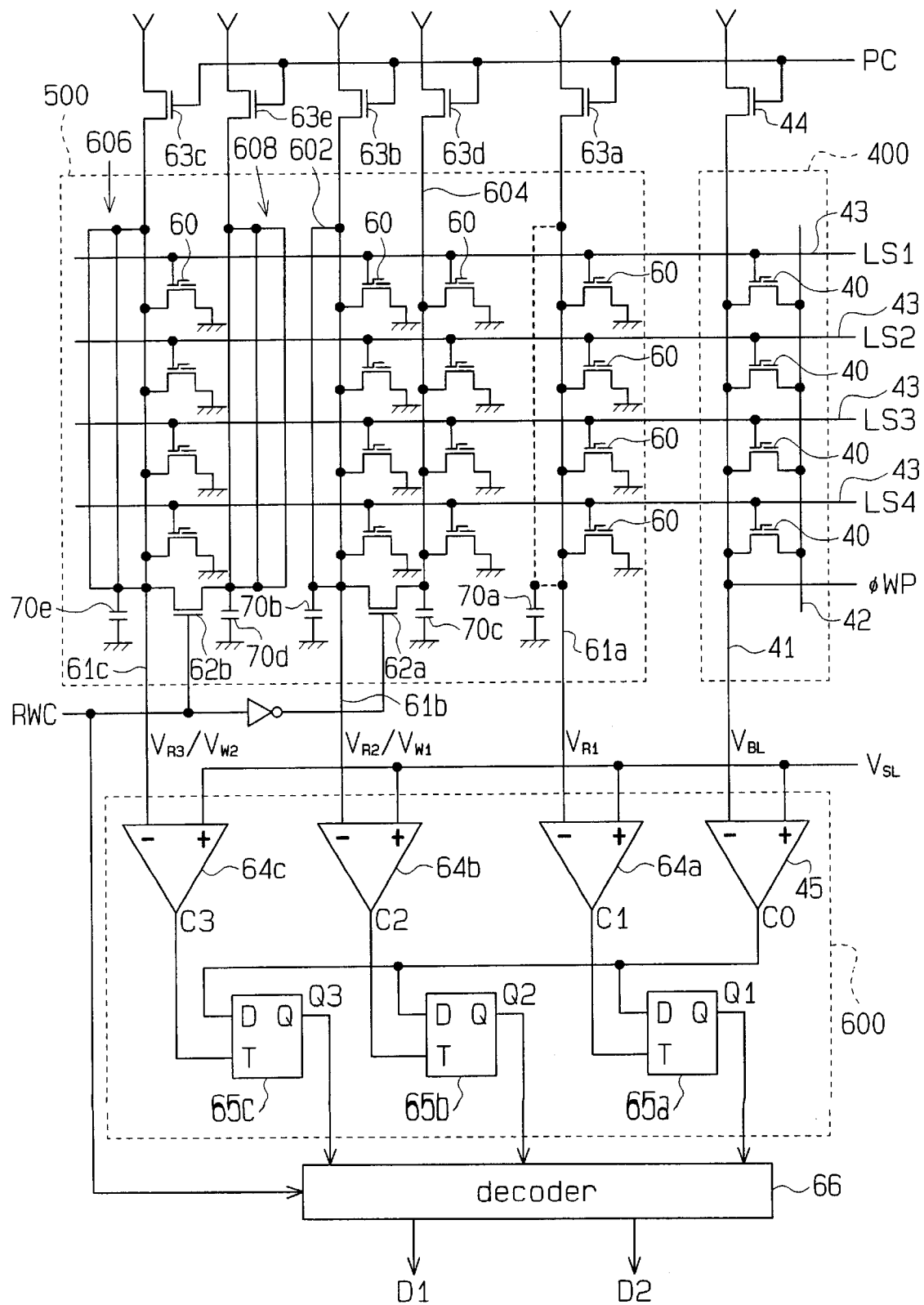
FIG. 11 is a schematic block diagram of a nonvolatile semiconductor memory device according to a modification of the second embodiment.

According to the second embodiment, it is preferable that, as shown in FIG. 11, compensation capacitors 70a to 70e, corresponding to a parasitic capacitance CP, be added to the first to third reference bit lines 61a–61c to compensate for an error in the capacitance ratio of the first to third reference bit lines 61a–61c. This is because a parasitic capacitance is produced in the line extending from the bit line 41 to the differential amplifier 45, and the differential amplifier 45 has a gate capacitance at its input stage. The sum of the parasitic capacitance and the gate capacitance is defined as the parasitic capacitance CP. The parasitic capacitance CP causes an error in the actual capacitance ratio of the first to third reference bit lines 61a–61c. With the capacitance of the bit line 41 being C0, the actual capacitance ratio of the first to third reference bit lines 61a–61c is given by (1.2C0+CP):(3C0+CP):(6C0+CP). The parasitic capacitance CP is an error in the capacitance ratio of the first to third reference bit lines 61a–61c. In general, to ensure the drive performance, the bit line 41 and the first to third reference bit lines 61a–61c are formed of metal lines having large parasitic capacitances. Therefore, the error originating from the parasitic capacitance CP is too small to raise a particular problem. When the miniaturization of the line pattern results in the use of lines having small parasitic capacitances, the error originating from the parasitic capacitance CP should not be ignored.

The compensation capacitor 70a is connected to the first reference bit line 61a. The compensation capacitor 70b is connected to the main line group 602 of the second reference bit line 61b, and the compensation capacitor 70c is connected to the sub line 604 of the second reference bit line 61b. The compensation capacitor 70d is connected to the second line group 608 of the third reference bit line 61c, and the compensation capacitor 70e is connected to the first line group 606 of the third reference bit line 61c. The compensation capacitor 70a preferably has a capacitance of about 0.2CP, the compensation capacitors 70b and 70e both have a capacitance of about 1CP, the compensation capacitor 70c has a capacitance of about 2CP, and the compensation capacitor 70d has a capacitance of about 3CP. With the compensation capacitors 70a–70d, the capacitance ratio of the first to third reference bit lines 61a–61c is expressed as follows:

(1.2C0+CP+0.2CP):(3C0+CP+2CP):(6C0+CP 5CP) =1.2(C0+CP):3(C0+CP):6(C0+CP).

The actual capacitance ratio of the first to third reference bit lines 61a–61c substantially matches with the target capacitance ratio. The actual capacitance ratio substantially coincides with the target capacitance ratio in the writing operation, as well as in the reading operation.

Third Embodiment

A nonvolatile semiconductor memory device according to a third embodiment of the present invention will now be discussed with reference to FIG. 12. The third embodiment differs from the first embodiment in that the differential amplifier 45 is not present, and the relationship between the connection of the first to third differential amplifiers 53a–53c with the first to third reference bit lines 51a–51c and the connection of the differential amplifiers 53a–53c with the first to third flip-flops 54a–54c. Specifically, the differential amplifiers 53a–53c and the flip-flops 54a–54c determine whether the first to third reference potentials $V_{R1}$ to $V_{R3}$ are higher or lower than the bit line potential $V_{BL}$ after a predetermined time t0 (see FIG. 13) elapses since the beginning of the discharging of the bit line 41 and the first to third reference bit lines 51a–51c.

The first differential amplifier 53a has an inverting input terminal for receiving the reference potential $V_{R1}$ of the first reference bit line 51a, a non-inverting input terminal for receiving the potential $V_{BL}$ of the bit line 41, and an output terminal for supplying a comparison output C1 to the data input terminal of the first flip-flop 54a. The second differential amplifier 53b has an inverting input terminal for receiving the reference potential $V_{R2}$ of the second reference bit line 51b, a non-inverting input terminal for receiving the potential $V_{BL}$ of the bit line 41, and an output terminal for supplying a comparison output C2 to the data input terminal of the second flip-flop 54b. The third differential amplifier 53c has an inverting input terminal for receiving the reference potential $V_{R3}$ of the third reference bit line 51c, a non-inverting input terminal for receiving the potential $V_{BL}$ of the bit line 41, and an output terminal for supplying a comparison output C3 to the data input terminal of the third flip-flop 54c.

The first flip-flop 54a receives a decision timing signal ST at the timing input terminal, latches the comparison output C1 of the differential amplifier 53a in response to the rising of the decision timing signal ST, and sends the latch output Q1 to the decoder 55. The decision timing signal ST rises after a given time passes since the selection (enabling) of a word line 43. The second flip-flop 54b latches the, *comparison output C2 of the differential amplifier 53b in response to the rising of the decision timing signal ST, and sends the latch output Q2 to the decoder 55. The third flip-flop 54c latches the comparison output C3 of the differential amplifier 53c in response to the rising of the decision timing signal ST, and sends the latch output Q3 to the decoder 55.

Figure 13:
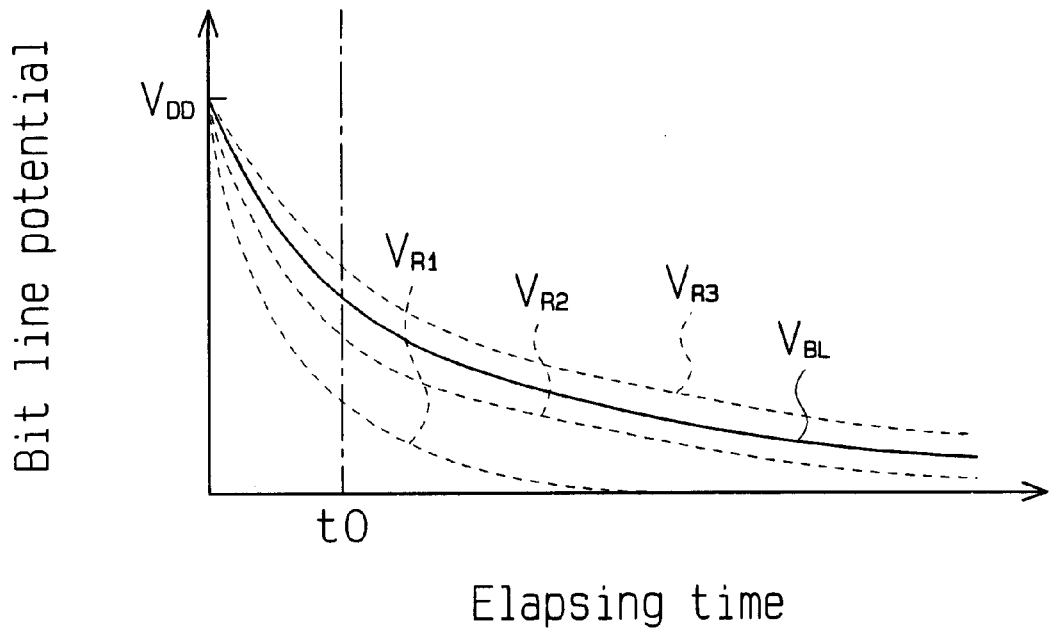
FIG. 13 is a graph showing the relationship between the potential of a reference bit line and the elapsing time in a reading operation of the memory device in FIG. 12.
Figure 14:
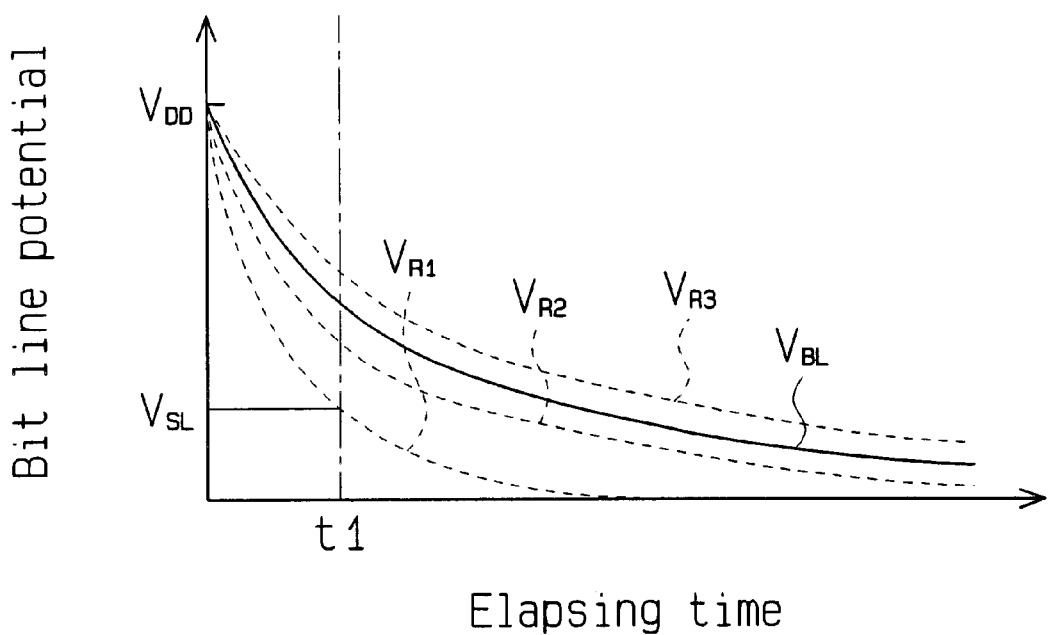
FIG. 14 is a graph depicting the relationship between the potential of a reference bit line and the elapsing time in the reading operation of a nonvolatile semiconductor memory device according to a fourth embodiment of the present invention.

Assume that in the reading operation, the bit line potential $V_{BL}$ drops to, for example, a level between the second reference potential $V_{R2}$ and the third reference potential $V_{R3}$ as shown in FIG. 13. The first and second reference potentials $V_{R1}$ and $V_{R2}$ are lower than the bit line potential $V_{BL}$, and the third reference potential $V_{R2}$ higher than the bit line potential $V_{BL}$. At the time t0, therefore, the first to third flip-flops 54a–54c latch the comparison outputs C1 of "H", C2 of "H" and C3 of "L" from the differential amplifiers 53a–53c, respectively, and send the latch outputs Q1 of "H", Q2 of "H" and Q3 of "L" to the decoder 55, respectively. The decoder 55 decodes the latch outputs Q1 of "H", Q2 of "H" and Q3 of "L" and produces 2-bit data D1 and D2 of "1, 0".

The decision timing signal ST is generated in synchronism with the row select signals LS1 to LS4, which enable the associated word lines 43. For example, the decision timing signal ST can be acquired by delaying the rise of the row select signals LS1 to LS4 by the discharge time. However, the stable decision timing signal ST is obtained by a delay circuit which is not susceptible to a change in temperature. The delay circuit results in an increase in the circuit area of the memory device. To eliminate the need for the delay circuit, therefore, it is preferable to design the memory device in such a way that when one (e.g., $V_{R1}$) of the first to third reference potentials $V_{R1}$–$V_{R3}$ drops to the predetermined decision potential $V_{SL}$, the bit line potential $V_{BL}$ is compared with the first to third reference potentials $V_{R1}$–$V_{R3}$. The fourth embodiment which will be discussed below is directed to a memory device which is capable of acquiring the stable decision timing signal ST without requiring a delay circuit.

Fourth Embodiment

A nonvolatile semiconductor memory device according to a fourth embodiment of the present invention will now be discussed referring to FIG. 15. The fourth embodiment employs a differential amplifier 70 to generate a stable decision timing signal ST.

Figure 15:
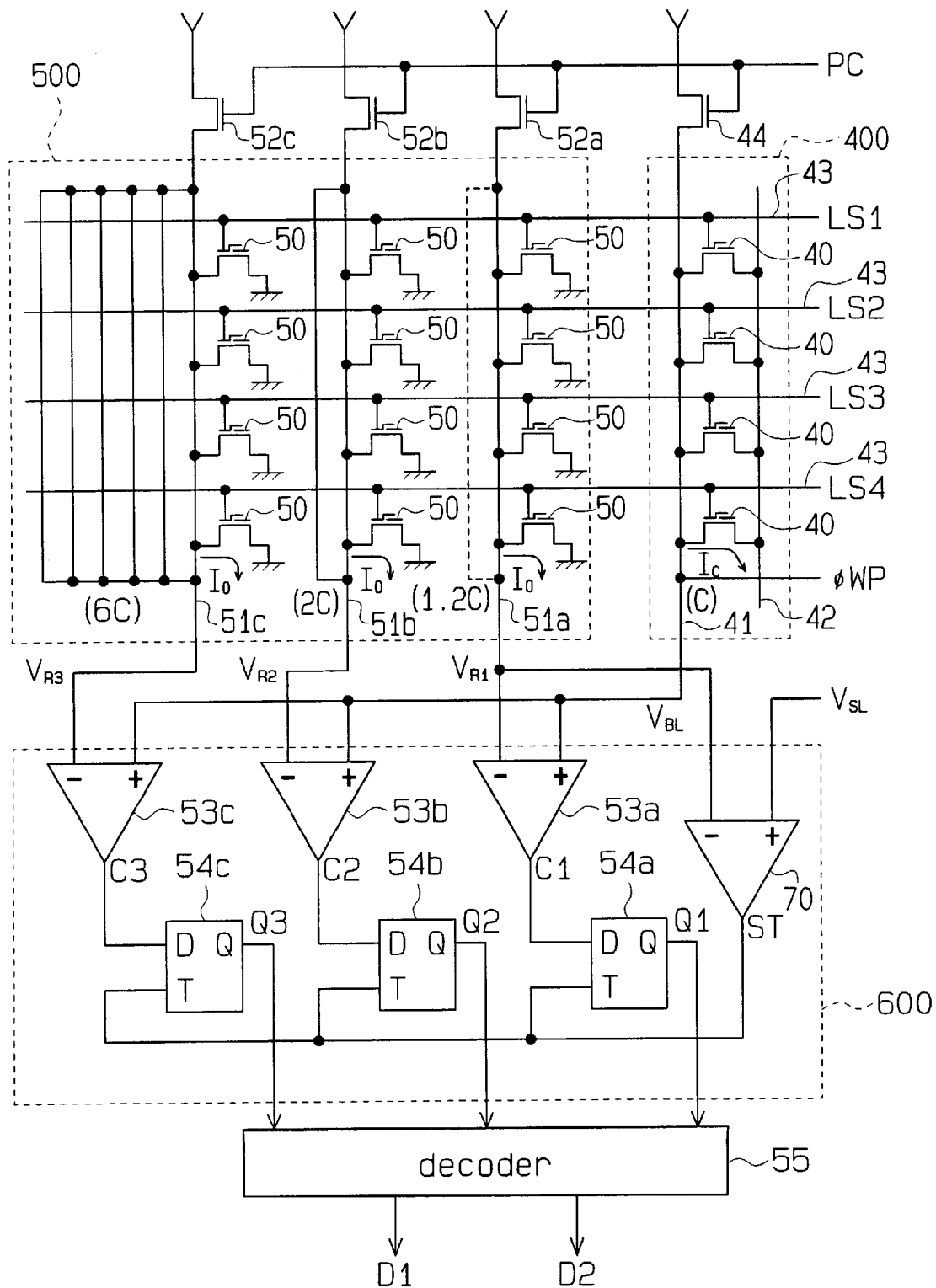
FIG. 15 is a block diagram of the nonvolatile semiconductor memory device according to the fourth embodiment of the present invention.

As shown in FIG. 15, the differential amplifier 70 has an inverting input terminal for receiving the first reference potential $V_{R1}$, a non-inverting input terminal for receiving the decision potential $V_{SL}$, which is set between the power supply potential and the ground potential, and an output terminal for supplying a comparison output originating from comparison between the first reference potential $V_{R1}$ and the decision potential $V_{SL}$, as the decision timing signal ST, to the timing input terminals of the first to third flip-flops 54a to 54c. The decision timing signal ST rises when the first reference potential $V_{R1}$ becomes lower than the decision potential $V_{SL}$ (timing t1) At time t1, the bit line potential $V_{BL}$ is compared with the first to third reference potentials $V_{RL}$–$V_{R3}$. The reference potential supplied to the inverting input terminal of the differential amplifier 70 may be the second or third reference potential $V_{R2}$ or $V_{R3}$. Since the first to third reference potentials $V_{R1}$–$V_{R3}$ fall at different dropping speeds, however, it is desirable to set the optimal decision potential $V_{SL}$ in accordance with the associated dropping speed.

According to the fourth embodiment, because the decision timing signal ST is produced by using the drop of any of the first to third reference potentials $V_{R1}$–$V_{R3}$ as mentioned above, the determining operation is carried out in response to the discharging operation of the bit line 41 and the first to third reference bit lines 51a–51c. The differential amplifier 70 thus provide the stable decision timing signal ST.

Fifth Embodiment

Figure 12:
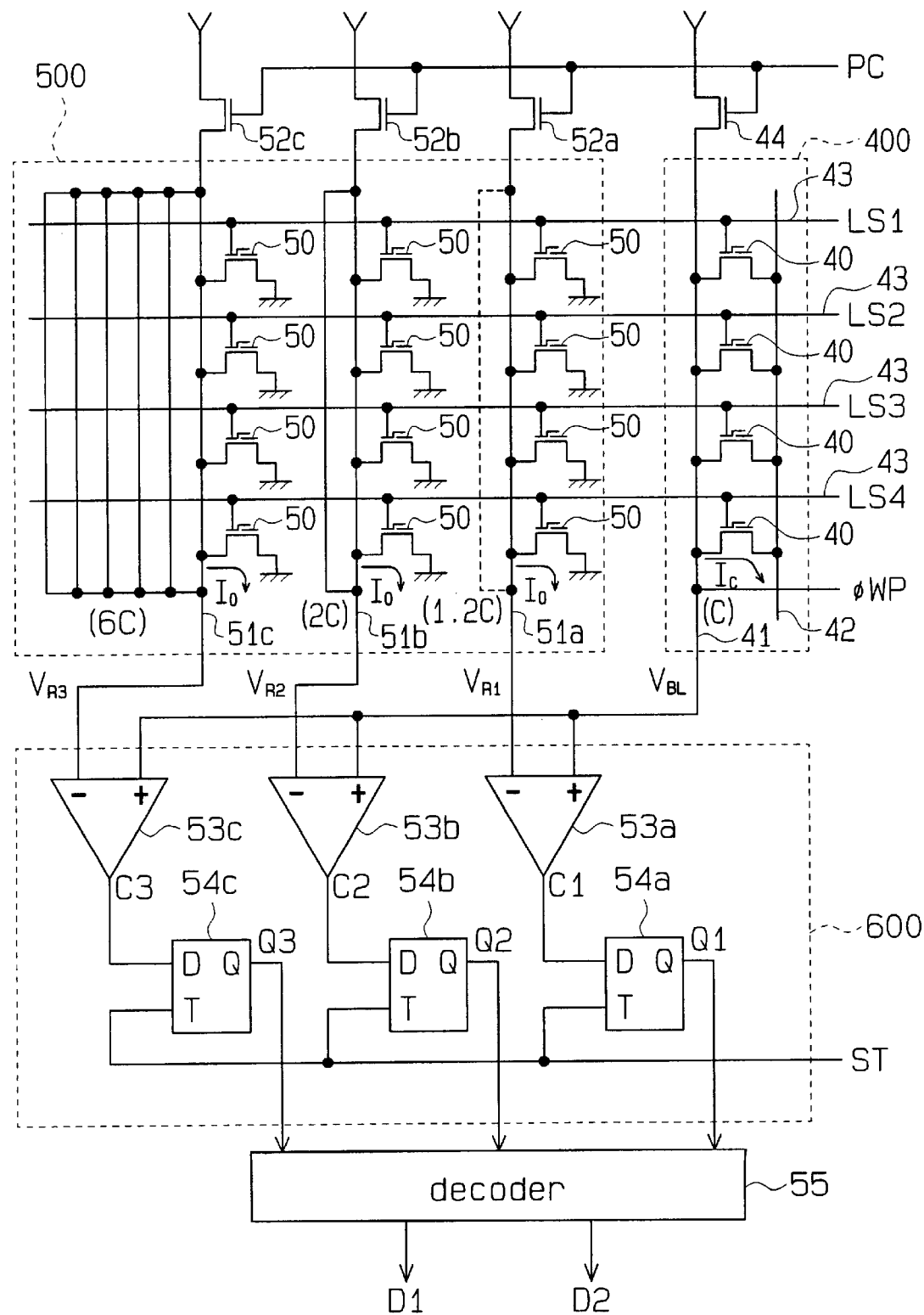
FIG. 12 is a schematic block diagram of a nonvolatile semiconductor memory device according to a third embodiment of the present invention.
Figure 16:
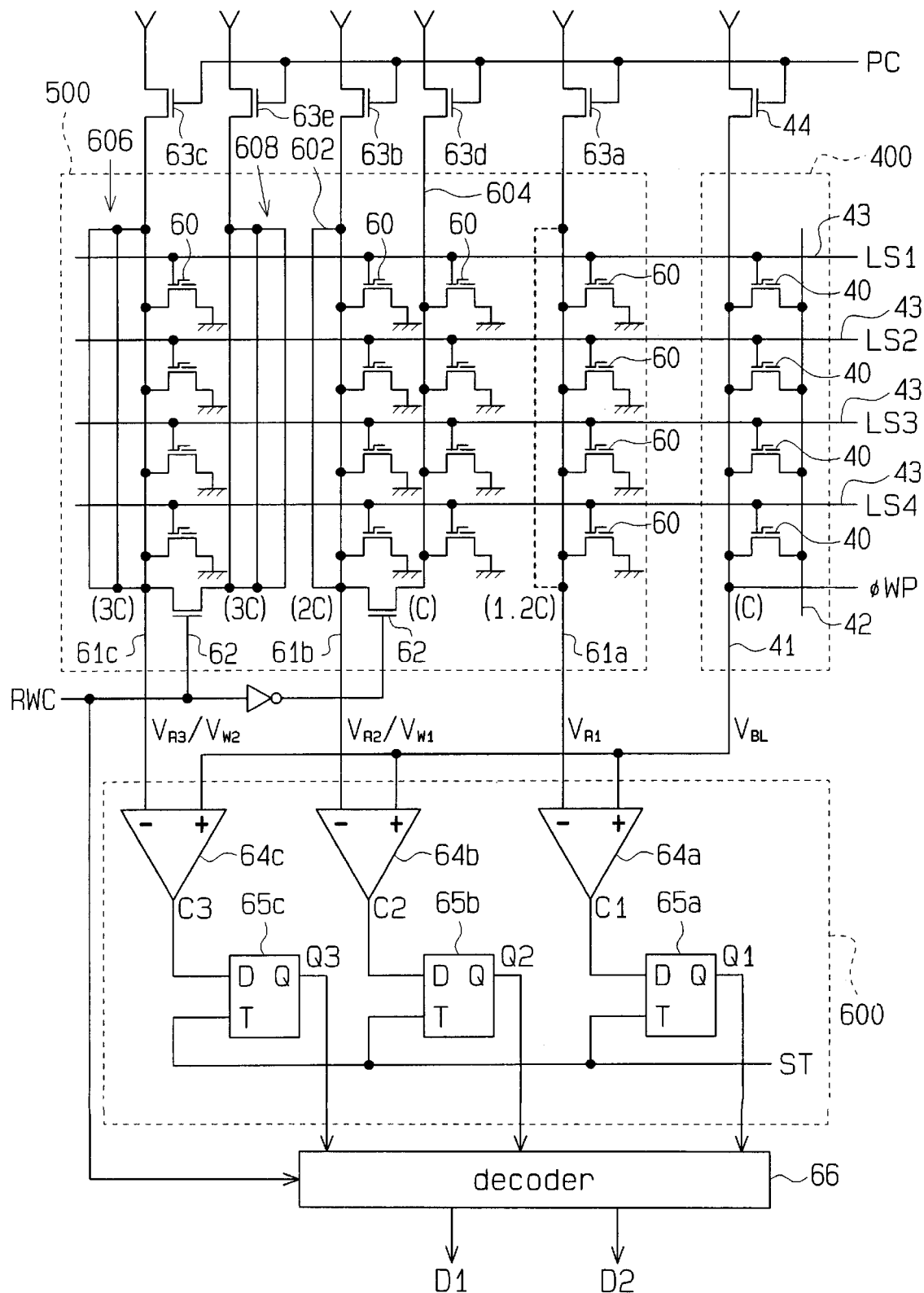
FIG. 16 is a block diagram of a nonvolatile semiconductor memory device according to a fifth embodiment of the present invention.

As shown in FIG. 16, a nonvolatile semiconductor memory device according to a fifth embodiment of the present invention is a combination of the second embodiment (FIG. 10) and the third embodiment (FIG. 12). That is, the function of the second embodiment is added to the memory device of the third embodiment. Therefore, like the second embodiment, the fifth embodiment selectively changes the potentials of the second and third reference bit lines 61b and 61c between the writing operation and the reading operation by switching the capacitances of the second and third reference bit lines 61b and 61c.

It should be apparent to those skilled in the art that the present invention may be embodied in many other specific forms without departing from the spirit or scope of the invention. Particularly, it should be understood that the invention may be embodied in the following forms.

The present invention may be adapted to a memory device which has memory cell transistors 40 arranged in a matrix of a plurality of rows by a plurality of columns. In this case, a column selecting circuit is provided between a plurality of bit lines and a differential amplifier and selectively connects one of bit lines to the differential amplifier.

Multi-state information stored in the memory cell transistors 40 may have eight states (three bits), sixteen states (four bits), and so on. In storing 8-state information, for example, seven reference transistors are assigned to one row of memory cell transistors. That is, the necessary number of reference transistors for determining multi-state information is assigned.

Therefore, the present examples and embodiments are to be considered as illustrative and not restrictive and the invention is not to be limited to the details given herein, but may be modified within the scope and equivalence of the appended claims.

What is claimed is:

1. A nonvolatile semiconductor memory device for storing two or more states the device comprising:
    a bit line;
    a plurality of memory cell transistors connected in parallel to said bit line, wherein each of the plurality of memory cell transistors has an insulated floating gate electrode in which a charge is stored, and each of the plurality of memory cell transistors changes a resistance thereof, when enabled, in accordance with the amount of charge stored in said floating gate electrode;
    a plurality of reference bit lines having mutually different capacitances, wherein said bit line and said plurality of reference bit lines are charged to a predetermined potential, changing speeds of the potentials of the plurality of reference bit lines being set in accordance with the capacitances;
    a plurality of reference transistors connected in parallel to each reference bit line and having the same structure as said memory cell transistors, a single row comprising one memory cell transistor and a plurality of reference transistors, each row of said memory cell transistor and said plurality of reference transistors being selectively enabled at a time; and
    a decision circuit, connected to said bit line and said plurality of reference bit lines, for comparing a potential of said bit line with a potential of each of said reference bit lines to determine information stored in the selected memory cell transistor when a current flows to said memory cell transistor and said plurality of reference transistors in a selected row from said bit line and said plurality of reference bit lines charged to said predetermined potential.

2. The memory device according to claim 1, wherein said decision circuit includes:

a first comparator, connected to said bit line, for comparing said potential of said bit line with a predetermined decision potential;

a plurality of second comparators, respectively connected to said reference bit lines, for comparing said decision potential with said potentials of the associated reference bit lines; and a plurality of latches, respectively connected to said second comparators, for latching an output of said first comparator in response to outputs of the associated second comparators.

3. The memory device according to claim 1, wherein at least one reference bit line selectively alters its own capacitance in response to switching between a read operation mode and a write operation mode.

4. The memory device according to claim 1, further comprising a compensation capacitor, connected to each of said reference bit lines, for compensating for a parasitic capacitance produced between said bit line and said decision circuit.

5. A nonvolatile semiconductor memory device for storing two or more states, the device comprising:

a bit line;

a plurality of memory cell transistors connected in parallel to said bit line, each memory cell transistor having an insulated floating gate electrode in which a charge is stored, and each of the plurality of memory cell transistors changes its own resistance, when enabled, in accordance with the amount of charge stored in said floating gate electrode;

a plurality of reference bit lines having mutually different capacitances, said bit line and said plurality of reference bit lines being charged to a predetermined potential, changing speeds of said predetermined potentials of said plurality of reference bit lines being set in accordance with the capacitances;

a plurality of reference transistors connected in parallel to each reference bit line and having the same structure as said memory cell transistors, a single row comprising one memory cell transistor and a plurality of reference transistors, each row of said memory cell transistor and said plurality of reference transistors being selectively enabled at a time; and a decision circuit, connected to said bit line and said plurality of reference bit lines, for comparing a potential of said bit lines with said potential of each of said reference bit lines to determine information stored in the selected memory cell transistor after a predetermined period of time passes since flowing of a current to said memory cell transistor and said plurality of references transistors in a selected row from said bit line and said plurality of reference bit lines charged to said predetermined potential.

6. The memory device according to claim 5, wherein said decision circuit includes:

a plurality of comparators, commonly connected to said bit line and respectively connected to said reference bit lines, for respectively comparing said potentials of the associated reference bit lines with said potential of said bit line; and a plurality of latches, respectively connected to said comparators, for latching outputs of the associated comparators in response to a predetermined timing signal.

7. The memory device according to claim 6, wherein said decision circuit includes a timing signal generator, connected to any one of said plurality of reference bit lines, for comparing said potential of the any one reference bit line with a predetermined decision potential and supplying a comparison result to said plurality of latches as said predetermined timing signal.

8. The memory device according to claim 5, wherein at least one reference bit line selectively alters its own capacitance in response to switching between a read operation mode and a write operation mode.

9. A method of determining information stored in a plurality of memory cell transistors in a nonvolatile semiconductor memory device having said memory cell transistors connected in parallel to a bit line, each of said plurality of memory cell transistors having an insulated floating gate electrode in which a charge is stored, each memory cell transistor changing its own resistance, when enabled, in accordance with the amount of charge stored in said floating gate electrode, said method comprising the steps of:

providing a plurality of reference bit lines having mutually different capacitances;

providing a plurality of reference transistors connected in parallel in each reference bit line and having the same structure as said memory cell transistors, a single row comprising one memory cell transistor and a plurality of reference transistors:

charging said bit line and said plurality of reference bit lines to a predetermined potential, changing speeds of the potentials of the plurality of reference bit lines being set in accordance with the capacitances;

selectively enabling each row of said memory cell transistor and said plurality of reference transistors at a time, thereby allowing a current to flow to said memory cell transistor and said plurality of reference transistors in a selected row from said bit line and said plurality of reference bit lines; and comparing a fluctuation of potential of said bit line with said potentials of each of said reference bit lines to determine information stored in said memory cell transistor in said selected row.

10. The method according to claim 9, wherein said determining step includes the steps of:

comparing said potential of said bit line and said potentials of the associated reference bit lines with a predetermined decision potential; and latching a result of comparing said potential of said bit line with said predetermined decision potential in accordance with a result of comparing said, potentials of the associated reference bit lines with said predetermined decision potential.

11. The method according to claim 9, further comprising the step of selectively changing a capacitance of at least one reference bit line in response to switching between a read operation mode and a write operation mode.

12. The method according to claim 9, wherein said determining step includes the steps of:

comparing said potentials of the associated reference bit lines with said potential of said bit line; and latching a comparison result after a predetermined period of time passes.

13. The method according to claim 12, wherein said determining step includes the step of comparing said potential of any one of said plurality of reference bit lines with a predetermined decision potential and supplying the comparison result as a timing signal for setting said predetermined period.

14. A nonvolatile semiconductor memory device comprising:

a plurality of memory cell transistors, each memory cell transistor having an insulated floating gate electrode in which a charge is stored, and each memory cell transistor changing a resistance thereof, when enabled, in accordance with an amount of charge stored in the floating gate;

a bit line connected to a drain of each of said memory cell transistors;

a source line connected to a source of each of said memory cell transistors, such that each of said memory cell transistors is connected in parallel between said bit line and said source line;

a plurality of reference transistors having generally the same structure as said memory cell transistors, said reference transistors being arranged in matrix, thereby defining rows and columns, and wherein said memory cell transistors are arranged as a column in the matrix such that one of said memory cell transistors is associated with a row of the reference transistors;

a plurality of reference bit lines, each of the reference bit lines connected to a respective drain of each of said memory cell transistors in a respective column of said memory cell transistors, wherein each reference bit line has a capacitance different than the other reference bit lines;

a plurality of word lines, each of said word lines connected to a respective gate of said memory cell transistors and said reference transistors in a respective row, said word lines for enabling the respective rows; and a decision circuit for comparing a potential of each of the reference bit lines with a predetermined decision potential, a changing speed of the potential of each of the reference bit lines being set in accordance with the capacitance, wherein multi-state information stored in said memory cell transistors is determined in accordance with a dropping speed of the potential of said bit lines and said plurality of the reference bit lines.

15. The memory device of claim 14 further comprising a plurality of precharge transistors, one precharge transistor being associated with each column, wherein each of the precharge transistors is connected between a power supply and the respective bit lines and wherein a precharge signal applied to a gate of the precharge transistors charges the respective bit line to a potential of the power supply.

16. The memory device of claim 14, wherein the decision circuit comprises:

a first comparator, having one input thereof connected to said bit line and an another input thereof connected to said predetermined decision potential, for comparing said potential of said bit line with said predetermined decision potential and generating a first comparison signal;

a plurality of second comparators, having respective one inputs thereof connected to said reference bit lines and the another inputs thereof connected to said predetermined decision potential, for generating respective plural second comparison signals; and a plurality of latches, respectively connected to said plurality of second comparators at a timing input thereof, and to the first comparison signal at a data input thereof, for latching said first comparison signal in response to the output of the associated second comparators.

17. The memory device of claim 14, wherein the decision circuit comprises:

a plurality of comparators, having respective one inputs thereof connected to said bit line and respective another inputs thereof connected, respectively, to one of said reference bit lines, for generating respective comparison signals; and a plurality of latches each latch having a data input thereof connected to a respective one of said comparison signals and a timing input thereof connected to a decision timing signal.

18. The memory device of claim 14, wherein the decision circuit comprises:

a first comparator, having one input thereof connected to one of the reference bit lines and an another input thereof connected to the predetermined decision potential, for comparing said potential of said one reference bit line with said predetermined decision potential and generating a first comparison signal;

a plurality of second comparators, having respective one inputs thereof connected, respectively, to the reference bit lines and the another inputs thereof connected to said predetermined decision potential, for generating respective plural second comparison signals; and a plurality of latches, respectively connected to said plurality of second comparators at a data input thereof, and to said first comparison signal at a timing input thereof, for latching said second comparison signal in response to said first comparison signal.

* * * * *